United States Patent [19]

Sebastiano et al.

[11] Patent Number: 4,933,057
[45] Date of Patent: Jun. 12, 1990

[54] APPARATUS AND PROCESS FOR THE DEPOSITION OF A THIN LAYER ON A TRANSPARENT SUBSTRATE

[75] Inventors: Francesco Sebastiano, Termoli; Liberto Massarelli, Vasto, both of Italy

[73] Assignee: Societa Italiano Vetro - SIV - S.p.A., San Salvo CH, Italy

[21] Appl. No.: 275,570

[22] Filed: Nov. 22, 1988

[30] Foreign Application Priority Data

Nov. 27, 1987 [IT] Italy ............................. 48644 A/87

[51] Int. Cl.⁵ ............................................. C23C 14/35
[52] U.S. Cl. ........................ 204/192.12; 204/298.06; 204/298.09; 204/298.14; 204/298.19
[58] Field of Search ................. 204/192.12, 298 CS, 204/298 ME, 298 FP, 298 SG, 298 PM, 298 TT, 298 AN

[56] References Cited

U.S. PATENT DOCUMENTS 3,878,085  4/1975  Corbani ............................. 204/298
4,428,816  1/1984  Class et al. ........................ 204/298
4,622,121  11/1986 Wegmann et al. ........... 204/298 SG

FOREIGN PATENT DOCUMENTS 141932   6/1982  German Democratic Rep. ..................................... 204/298
62-77460 4/1987  Japan ............................ 204/298 SG Primary Examiner—Aaron Wiesstuch
Attorney, Agent, or Firm—Wenderoth, Lind & Ponack

[57] ABSTRACT

The present invention provides an apparatus and process for depositing a thin layer on the surface of a transparent substrate by the known process of cathodic sputtering. Atoms for forming the thin layer are produced from four cathodic plates arranged so as to form a rectangular parallelepiped. An anode covers one open end of the parallelepiped, and the substrate receving the thin layer is placed at the other open end of the parallelepiped. A magnetic field is produced by a permanent magnet, and the entire apparatus is supported by a metal support. A cooling channel surrounds the parallelepiped to enable the cooling of the cathodic plates.

8 Claims, 3 Drawing Sheets

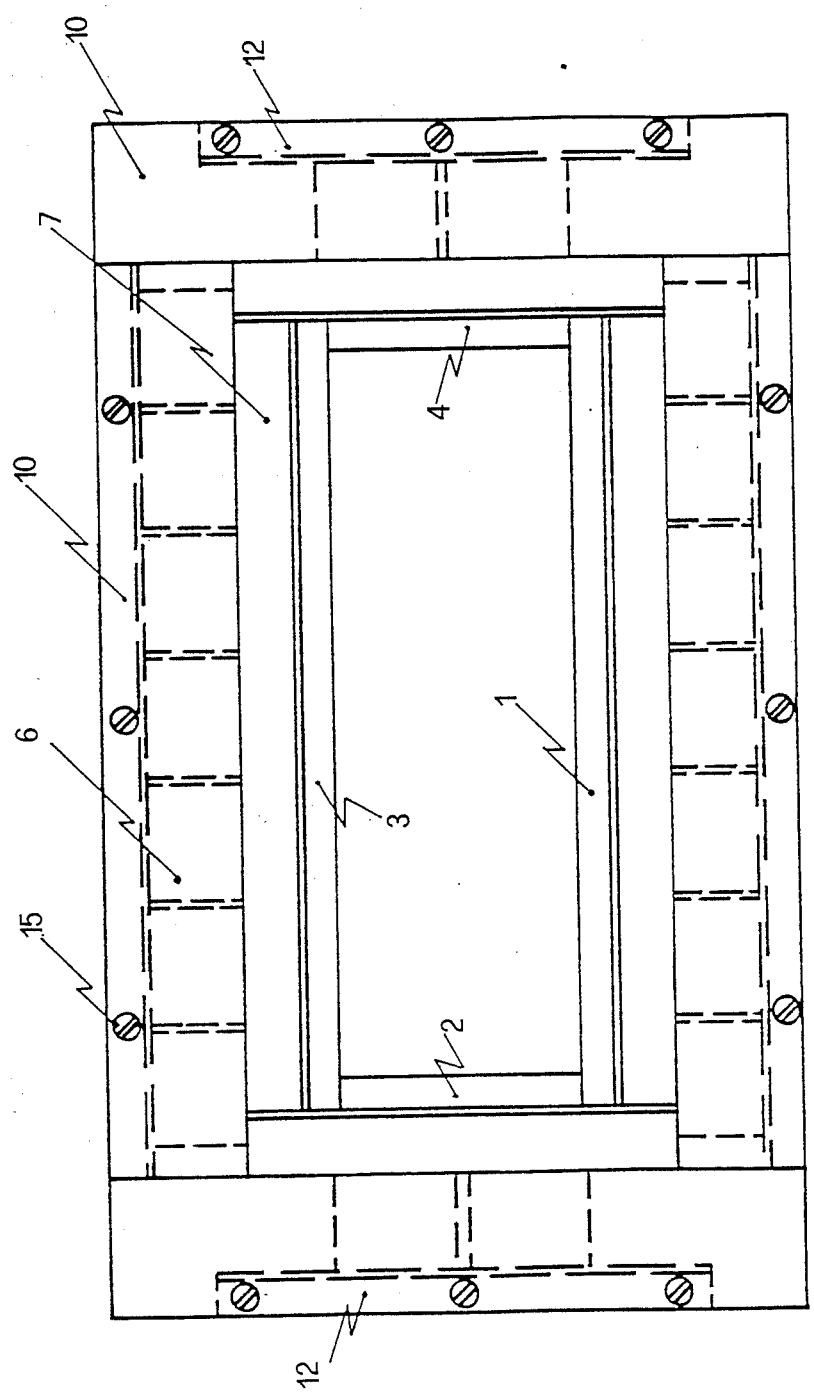

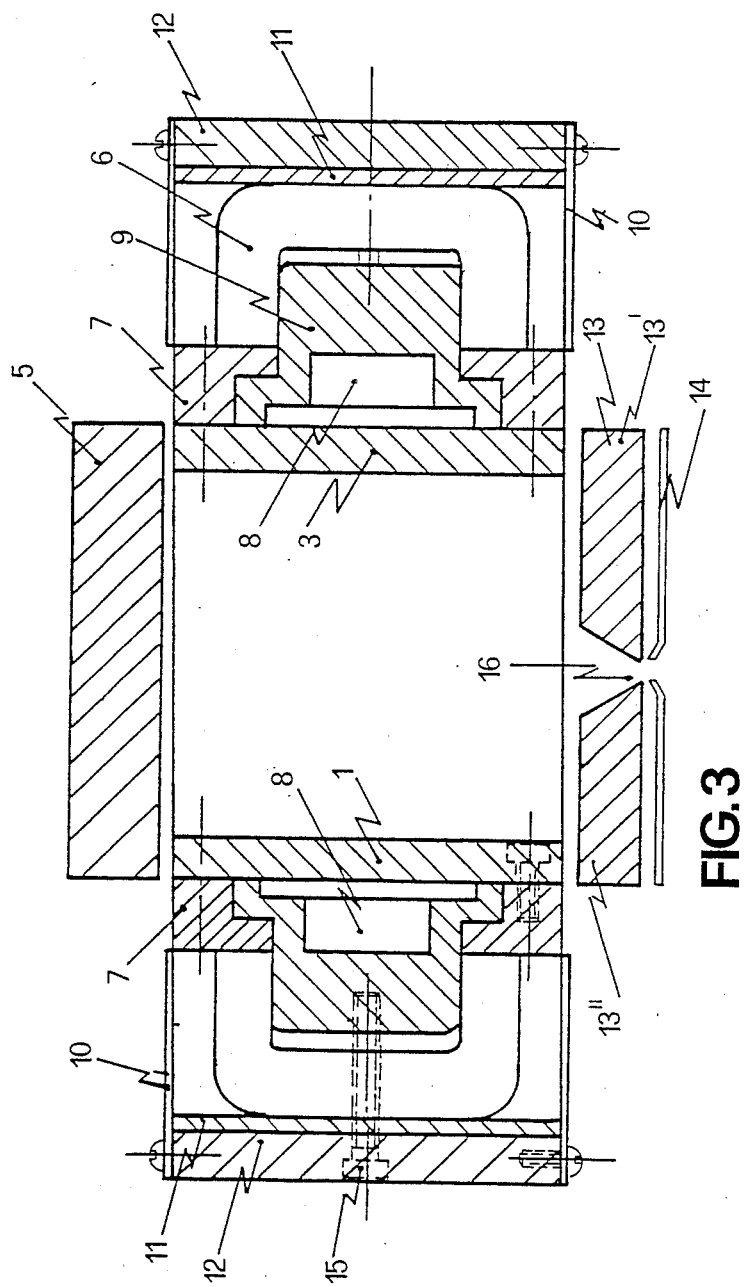

APPARATUS AND PROCESS FOR THE DEPOSITION OF A THIN LAYER ON A TRANSPARENT SUBSTRATE

BACKGROUND OF THE INVENTION

1. Field of the Invention

The present invention relates to an apparatus and process for the deposition of a thin layer on the surface of a transparent substrate, and to obtaining a very high quality in the thin layer with respect to that obtainable with the prior state of the art.

In this context and in the following description, by the term "thin layer" is meant a film formed with appropriate materials, generally metals, having a depth of some tenths of some hundredths of Å, which is deposited as a coating on the surface of a substrate, such as glass, to provide this surface with modified physical, mechanical, electrical or optical characteristics.

2. Description of the Prior Art

From the prior art a plurality of processes and apparatuses are known for the deposition of thin layers.

In the following description reference is made in particular to the method of thin layer deposition using cathodic sputtering. In this field of technology a great number of patent and bibliographic references are available.

As an example, U.S. Pat. Nos. 2,146,025; 3,282,816; 3,400,066; 4,041,353 describe a process of deposition of a metal on a substrate and the devices for carrying out this process.

U.S. Pat. Nos. 3,616,450 and 3,711,398 teach the construction of an apparatus for the deposition of a thin layer on a substrate by using a cylinder-shaped cathode having the anode on one side and the substrate to be coated on the opposite side.

In this apparatus the atoms detaching from the inner wall of the cylinder produce a thin layer on the surface of a substrate placed in a perpendicular direction to the axis of the cylinder.

In U.S. Pat. No. 3,878,085 an apparatus is described for the deposition of a thin layer on flat surfaces which uses a cathode formed as a single elliptically-shaped flat plate, enabling an improved deposition efficiency.

In the same patent are also described advantages deriving from the use of magnetic fields connected to the cathodes, which advantages include the ability to reduce the voltage required to produce an electric discharge.

Other illustrations of apparatuses for the deposition of thin layers on substrates are described in U.S. Pat. Nos. 4,060,470 and 4,472,259.

The method of cathodic sputtering for the deposition of thin layers is also described in the text by L. Holland "Vacuum Deposition of Thin Films", pages 401–460, published by "Chapman and Hall Ltd." and in the text by L. I. Maissel and R. Clang, "Handbook of Thin Film Technology", pages 3-1 to 4-44, published by "McGraw Hill".

This method consists essentially of the fact that gas ions produced by an electric discharge, are accelerated towards the cathode, and by impact thereon atoms are extracted which are deposited on the surface of the substrate, forming the desired coating.

The adherence of the coatings thus obtained, however, is not such as to ensure a product of good quality, especially when the thin layer is placed directly in contact with the external environment.

This disadvantage is a considerable restriction to the commercial use of products coated with thin layers, such as sheets of glass for the windows of buildings and motorcars.

J. S. Williams and J. M. Poate, in their book "Ion Implantation and Beam Processing", published by Academic Press (pages 189–259), have described an experiment carried out on laboratory specimens according to which when an ion a bombardment of the coating with ions is carried out while the thin layer is formed by action of the atoms issued by the cathode, a thin layer is obtained which shows adherence and uniformity characteristics far higher than those known so far.

OBJECT OF THE INVENTION

The object of the present invention is to provide an apparatus and process capable of effecting a commercial application of this technology, tested, previously only on a laboratory scale, and in particular when a considerable size substrate is to be treated, compared with a laboratory specimen. Typically, in the case in which the substrate is a sheet of glass, the reference size is that related to an application in a building and/or in a motor car.

SUMMARY OF THE INVENTION

The present invention solves the problem of providing an apparatus for a deposition of a thin layer on a substrate by making use of a deposition of atoms extracted from a cathode and simultaneously to the formation thereof, bombarding the layer with ions.

This invention further provides a process for the manufacture of this thin layer.

By the use of an apparatus and process of this type, thin layers are obtainable deposited on a substrate of any type, provided with high adherence and uniformity characteristics, so as to enable the use of the layers in situations involving exposure to the external environment.

In using the present invention, the great production of ions by the apparatus, enables the substrate to be coated to be placed at a greater distance than that obtainable by the known art. The amount of feed gas used in the system can be reduced, enabling a purer coating to be obtained.

The present invention provides an apparatus for depositing a thin layer on the surface of a transparent substrate by the known process of cathodic sputtering. Atoms for forming the thin layer are produced from four cathodic plates arranged so as to form a rectangular parallelepiped, each cathodic plate thus forming a 90° angle with the plates adjacent to it. A magnetic field is produced around the rectangular parallelepiped by a group of permanent magnets, and the entire apparatus is supported by a metal support. A channel is provided to enable the cooling of the apparatus.

The present invention further provides a process for the deposition of a thin layer on the surface of a substrate. The process comprises the following steps: producing a vacuum in a glass or metal chamber containing the apparatus of the invention;

introducing a gas at a pressure between 10.1 and 10.2 Pascal;

exciting the cathode and the anode by a feed voltage from 200 to 1000 V; and emitting simultaneously a flow of atoms and ions in an amount sufficient to deposite a thin layer on a substrate and to effect a bombardment of the layer with ions.

BRIEF DESCRIPTION OF THE DRAWINGS

The present invention will be further illustrated by reference to the accompanying drawings which show a non-limitative embodiment, and in which:

FIG. 2 is a diagrammatic view from the bottom of the apparatus of the invention; and FIG. 3 illustrates a modification of the apparatus of FIG. 1 in a diagrammatic transversal cross-sectional view.

DESCRIPTION OF THE PREFERRED EMBODIMENTS

Figure 1:
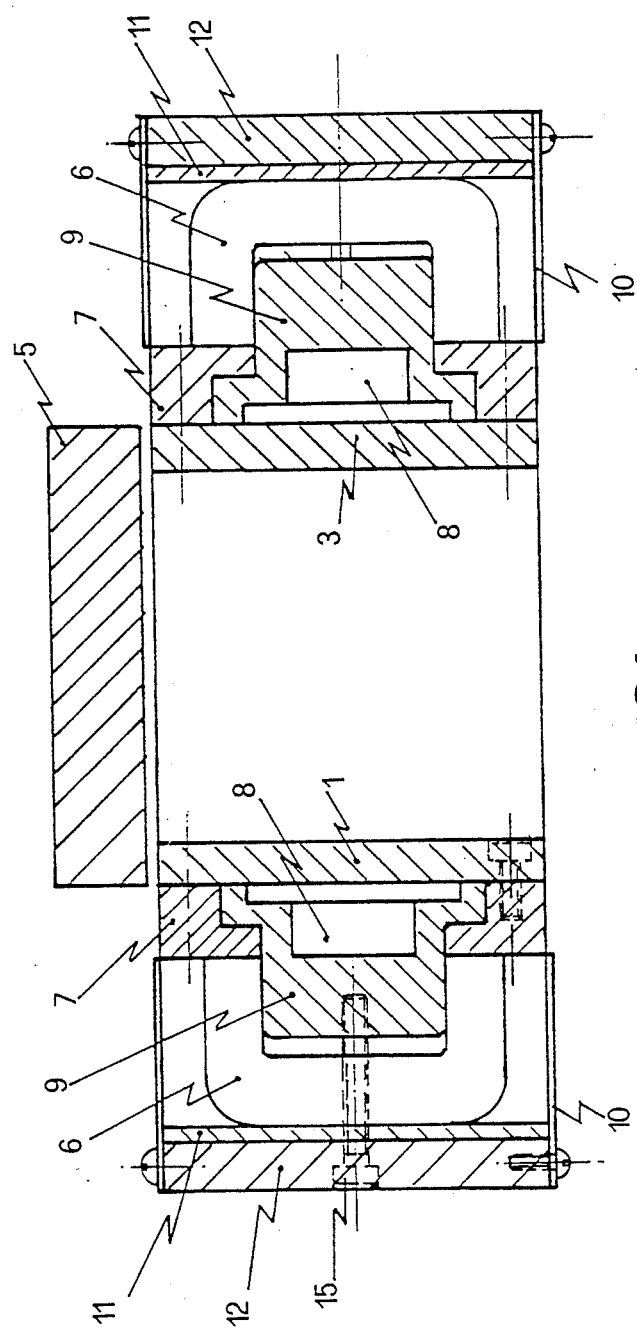
FIG. 1 is a diagrammatic transversal cross-section view of the apparatus of the invention.

According to the present invention and referring to FIGS. 1 and 2, the apparatus comprises a flat plate 5, hereinafter identified as an anode, electrically connected to the positive terminal of an electric power supply, (not shown) and four plates, independent one from the other, hereinafter denominated as cathodic plates, and indicated in the figures with reference numbers 1 to 4, electrically connected to the negative terminal of the same power supply by means of appropriate connections.

The cathodic plates 1 to 4 are so placed as to form a 90° angle on the anode 5, and each of the cathodic plates 1 to 4 forms a 90° angle with the adjacent plate. By this arrangement the cathodic plates 1 to 4 form a rectangular parallelepiped, the vertical walls of which are formed by the plates, and the horizontal faces of which the lower horizontal face is open and the upper horizontal face is closed by the anode 5.

The cathodic plates 1 to 4 are made of the same material that is intended to be deposited, in the form of a thin layer, on the substrate.

Permanent magnets 6 and magnetic poles 7 are placed around the cathodic plates 1 to 4 to close the magnetic ring.

De-ionized cooling water flows in a channel 8 to maintain the temperature of the cathodic plates 1 to 4 within acceptable limits.

The cooling channel 8 is closed on one side by the inner surface of the plates 1 to 4 and on the other side by a support 9 which further supports the permanent magnet 6 by means of screws 15. Metal equipotential surfaces 10 serve the purpose of avoiding an internal electric discharge, whereas a magnetic metal sheet 11 forms the external closure of the magnetic circuit.

The entire apparatus is supported on a metal support 12 which also has an equipotential function.

The above described apparatus is placed within a glass or metal chamber, not shown in the figure, inside which a vacuum is produced. A gas is then introduced at a pressure from 10.1 to 10.2 Pascal, and the cathodes 1 to 4 are fed by a voltage from 200 to 1000 V.

The gas is ionized, generating an electric discharge between the anode and the cathodes. The gas ions in the discharge are accelerated towards the cathodes and when they make contact with the cathodes one or more atoms are expelled by impact. The atoms thus detached are directed in the reverse direction with an energy in proportion to that of the incident ion and are mainly directed towards the opposite wall, at an angle restricted within 30°. Consequently the atoms end their path generally on the opposite cathode and turn back in the reverse direction, provided that they do not hit other particles.

By these rebounds the atoms have a great probability of striking the electrons of the gas forming the plasma, and they can in turn be ionized. A large amount of ions is thus formed between the walls of the cathodes 1 to 4, and they are directed by the positive charge of the anode 5 towards the opposite opening and then to the substrate on which they are deposited, simultaneously with the atoms, to produce the desired coating.

In order to obtain an efficient ionization of the atoms and consequently an amount of ions sufficient to produce the desired thickening of the thin layer, the distance between the cathodic plates 1 and 3 is less than 70 mm. Moreover the ratio of this distance to the height of the cathodic plates 1 and 3 is from 1:1 to 1:2.

As illustrated above, the present invention provides simultaneous flows, produced by the same source, of ions and atoms which, once deposited, realize products which can be advantageously used in contact with the external environment. These products are novel and representative thereof are sheets of glass coated with thin layers, which can be used for windows in buildings and motor cars.

According to a modified embodiment illustrated in FIG. 3, in which elements similar or identical to those above described are indicated, for the sake of simplicity, with the same reference numerals as the apparatus illustrated in FIGS. 1 and 2, a second anode 13 can be added positioned parallel to the anode 5, and the anode 13 is separately fed with a voltage different from the anode 5.

The second anode 13 is made of two portions 13' and 13", and is provided with a slit 16 through which the ion flow is concentrated.

Externally to the second anode 13 an additional electrode 14 is placed serving the purpose of simultaneously extracting and accelerating the ions.

The electrode 14 is fed by a negative voltage from 5 Kv to 500 Kv to attract and accelerate the ions.

The electrode group 13 and 14 forms a true system of electric lenses so that, in addition to being accelerated, the ions can also be focused.

By an apparatus as illustrated in FIG. 3 it is possible to obtain a much greater internal and focused ion bombardment, which will result in the possibility of improving the adherence of the thin layer to the substrate in particular restricted areas.

Whereas some preferred embodiments of the invention have been described, it will be understood that variations and modifications can be realized which fall within the scope thereof.

It is possible, in fact, to replace the flat cathodic plates 1 and 3 of FIGS. 1 to 3, by cathodic plates 1 and 3 having any curvature radius whatsoever, with the cathodic plate 1 having its concavity facing the cathodic plate 3 and vice versa.

In this case also the maximum distance between the inner surfaces of the cathodic plates 1 and 3 is lower than 70 mm and the ratio of this distance and the height of the cathodic plates can range from 1:1 to 1:2.

We claim:

1. An apparatus for depositing a thin layer on the surface of a transparent substrate by cathodic sputtering, said apparatus comprising:
    a plurality of cathode plates arranged in a contiguous relationship to form an open-ended enclosed space for producing atoms to be deposited on a substrate, said cathode plates defining an open-ended rectangular parallelepiped having two opposite short sides and two opposite long sides, said parallelepiped having a ratio of the length of said short sides to the height of said plates of 1:1 to 1:2, and said length of said short sides being less than 70 mm;

magnetic means disposed about said plurality of cathode plates for producing a magnetic field;

cooling means for cooling said cathode plates; and an anode at one open end of said rectangular parallelepiped disposed so as to form a substantially 90° angle with each of said cathodic plates, wherein a transparent substrate can be positioned at the other open end of said open-ended rectangular parallelepiped such that upon application of a voltage to said cathode plates and said anode to produce atoms in an amount sufficient to deposit a thin layer of atoms on the surface of the transparent substrate, ions are produced in an amount sufficient to bombard the thin layer, thereby improving the characteristics of the thin layer.

2. The apparatus as set forth in claim 1, wherein:
said anode is a first anode; and
a second anode is disposed at the other open end of said open ended rectangular parallelepiped opposite to and parallel with said first anode, said second anode having a slit therein through which a flow of atoms can pass.

3. The apparatus as set forth in claim 2, and further comprising:
an electrode disposed parallel to said second anode, said electrode disposed adjacent to a side of said second anode facing away from said open ended rectangular parallelepiped.

4. The apparatus as set forth in claim 1, wherein:
said cooling means comprises a cooling channel surrounding said plurality of cathodic plates.

5. The apparatus as set forth in claim 1, wherein:
said magnetic means comprises a permanent magnet surrounding said plurality of cathodic plates.

6. The apparatus as set forth in claim 5, and further comprising:
a support member surrounding said permanent magnet.

7. A process for depositing a thin layer on a surface of a substrate comprising the steps of:
providing a chamber;
providing in said chamber an apparatus for depositing a thin layer on the surface of a transparent substrate by cathodic sputtering, said apparatus comprising:
a plurality of cathode plates arranged in a contiguous relationship to form an open-ended enclosed space for producing atoms to be deposited on a substrate, said cathode plates defining an open-ended rectangular parallelepiped having two opposite short sides and two opposite long sides, said parallelepiped having a ratio of the length of said short sides to the height of said plates of 1:1 to 1:2, and said length of said short sides being less than 70 mm;
magnetic means disposed about said plurality of cathode plates for producing a magnetic field;
cooling means for cooling said cathode plates; and
an anode at one open end of said rectangular parallelepiped disposed so as to form a substantially 90° angle with each of said cathodic plates, wherein a transparent substrate can be positioned at the other open end of said open-ended rectangular parallelepiped such that upon application of a voltage to said cathode plates and said anode to produce atoms in an amount sufficient to deposit a thin layer of atoms on the surface of the transparent substrate, ions are produced in an amount sufficient to bombard the thin layer, thereby improving the characteristics of the thin layer;
placing a substrate in front of said anode;
producing a vacuum in said chamber;
introducing a gas into said chamber at a pressure of 10.1 to 10.2 Pascal;
providing said cathode plates and said anode with a voltage of 200 to 1000 V to ionize said gas; and
emitting from said rectangular parallelepiped a flow of atoms and a flow of ions in amounts sufficient to respectively deposit a thin layer of atoms on the surface of the substrate and bombard said thin layer with said flow of ions.

8. The process as set forth in claim 1, and further comprising the step of:
focusing said flow of said atoms and said ions on a restricted area of said substrate.

* * * * *